United States Patent
Moeneclaey et al.

(10) Patent No.: US 10,868,547 B2
(45) Date of Patent: Dec. 15, 2020

(54) DEVICE FOR DETERMINING A PROPAGATION TIME

(71) Applicant: STMicroelectronics (Grenoble 2) SAS, Grenoble (FR)

(72) Inventors: Nicolas Moeneclaey, Vourey (FR); Cedric Tubert, Saint-Egreve (FR); Arnaud Authie, Coublevie (FR)

(73) Assignee: STMicroelectronics (Grenoble 2) SAS, Grenoble (FR)

(*) Notice: Subject to any disclaimer, the term of this patent is extended or adjusted under 35 U.S.C. 154(b) by 0 days.

(21) Appl. No.: 16/560,183

(22) Filed: Sep. 4, 2019

(65) Prior Publication Data
US 2020/0099381 A1    Mar. 26, 2020

(30) Foreign Application Priority Data
Sep. 25, 2018 (FR) ...................... 18 58746

(51) Int. Cl.
*H03L 7/091* (2006.01)
*H03M 3/00* (2006.01)

(52) U.S. Cl.
CPC .............. *H03L 7/091* (2013.01); *H03M 3/30* (2013.01)

(58) Field of Classification Search
CPC ........... G01N 29/07; H03L 7/091; H03M 3/30
See application file for complete search history.

(56) References Cited

U.S. PATENT DOCUMENTS

| | | | | |
|---|---|---|---|---|
| 5,537,077 A * | 7/1996 | Schnizlein | ............... | G10H 7/02 327/589 |
| 5,727,038 A * | 3/1998 | May | ..................... | H03D 13/004 331/25 |
| 6,075,387 A * | 6/2000 | Urbansky | .............. | H03L 7/085 327/12 |
| 6,330,034 B1 * | 12/2001 | Renner | ................... | H03L 7/087 348/505 |
| 6,580,376 B2 | 6/2003 | Perrott | | |
| 6,696,843 B1 * | 2/2004 | Beneteau | ................ | G01F 1/667 324/640 |
| 6,741,109 B1 * | 5/2004 | Huang | .................... | H03L 7/081 327/148 |
| 6,825,785 B1 * | 11/2004 | Huang | .................... | H03L 7/093 341/141 |
| 7,342,460 B2 * | 3/2008 | Batchelor | ............... | H03L 1/026 331/10 |
| 7,573,955 B2 * | 8/2009 | Gazsi | ...................... | H03L 7/085 375/327 |
| 8,248,104 B2 * | 8/2012 | Maeda | ................... | H03D 13/00 327/115 |
| 9,246,499 B2 * | 1/2016 | Balachandran | ......... | H03L 7/099 |
| 9,612,266 B2 * | 4/2017 | Moedl | ....................... | G01D 5/24 |
| 10,268,164 B2 * | 4/2019 | Tsutsumi | .................. | H03L 7/23 |
| 10,298,244 B2 * | 5/2019 | Hossain | ................. | H03L 7/235 |
| 2008/0317186 A1 | 12/2008 | Vaananen | | |
| 2011/0125017 A1 * | 5/2011 | Ramamurthy | ........... | A61B 8/08 600/443 |

(Continued)

*Primary Examiner* — Paulos M Natnael
(74) *Attorney, Agent, or Firm* — Slater Matsil, LLP

(57) ABSTRACT

The invention concerns a device including: first and second detectors of the phase and/or of the frequency of an input signal with respect to first and second reference signals; and a Sigma/Delta converter interpreting outputs of the first or of the second phase and/or frequency detector to determine a propagation time of the input signal.

20 Claims, 4 Drawing Sheets

(56) References Cited

U.S. PATENT DOCUMENTS

| | | | |
|---|---|---|---|
| 2014/0055676 A1* | 2/2014 | Matsumoto | H03M 3/458 348/572 |
| 2018/0219704 A1 | 8/2018 | Song et al. | |

* cited by examiner

DEVICE FOR DETERMINING A PROPAGATION TIME

CROSS-REFERENCE TO RELATED APPLICATIONS

This application claims priority to French Patent Application No. 1858746, filed on Sep. 25, 2018, which application is hereby incorporated herein by reference.

TECHNICAL FIELD

The present disclosure generally concerns electronic equipment, and more particularly an electronic device for determining a propagation time of a signal transmitted through the equipment.

BACKGROUND

Different types of electronic devices are equipped with a device of determination of a propagation time of signals transmitted through such electronic devices.

To measure the propagation time of a signal in an electronic device, it is usual to use a Sigma/Delta-type converter.

It would be desirable to at least partly improve certain aspects of already-existing devices of measurement of the propagation time of a signal.

SUMMARY

An embodiment provides a device comprising: first and second detectors of the phase and/or of the frequency of an input signal with respect to first and second reference signals and a Sigma/Delta converter interpreting outputs of the first or of the second phase and/or frequency detector to determine a propagation time of the input signal.

According to an embodiment, the second reference signal is equal to the complementary of the first reference signal.

According to an embodiment, the Sigma/Delta converter is capable of performing a comparison with a threshold.

According to an embodiment, the threshold corresponds to a half-period of the first or of the second reference signal.

According to an embodiment, the Sigma/Delta converter is a converter of the first order.

According to an embodiment, the device further comprises a multiplexer capable of transmitting the outputs of the first and of the second phase and/or frequency detector to the Sigma/Delta converter.

According to an embodiment, the multiplexer is capable of being controlled by a control signal originating from the Sigma/Delta converter.

According to an embodiment, the device further comprises a detector of the phase of an input signal with respect to the first reference signal, having an output coupled to an input of the first and of the second detector of the phase and/or of the frequency of the input signal.

According to an embodiment, the device further comprises a synchronization device coupled to the phase and/or frequency detectors, to the multiplexer, and to the Sigma/Delta converter.

According to an embodiment, the multiplexer is capable of being controlled by a signal originating from the synchronization device.

Another embodiment provides another device comprising: a detector of the phase of an input signal with respect to a first reference signal; a first detector of the phase and/or of the frequency of said input signal with respect to the first reference signal having an input coupled to the output of said phase detector; and a Sigma/Delta converter interpreting outputs of the first detector of the phase and/or of the frequency of the input signal to determine a propagation time of the input signal.

According to an embodiment, the device further comprises a multiplexer.

According to an embodiment, the device further comprises a synchronization device coupled to the first phase and/or frequency detector, to the multiplexer, and to the Sigma/Delta converter.

According to an embodiment, the Sigma/Delta converter is capable of performing a comparison with a threshold.

According to an embodiment, the Sigma/Delta converter is a converter of the first order.

According to an embodiment, the device further comprises a second detector of the phase and/or of the frequency of the input signal with respect to a second reference signal.

According to an embodiment, the second reference signal is equal to the complementary of the first reference signal.

According to an embodiment, the synchronization device is coupled to the second phase and/or frequency detector.

The foregoing and other features and advantages will be discussed in detail in the following non-limiting description of specific embodiments in connection with the accompanying drawings.

BRIEF DESCRIPTION OF THE DRAWINGS

FIG. 2 illustrates, in the form of timing diagrams, the operation of the device of

FIG. 1;

DETAILED DESCRIPTION OF ILLUSTRATIVE EMBODIMENTS

Figure 1:
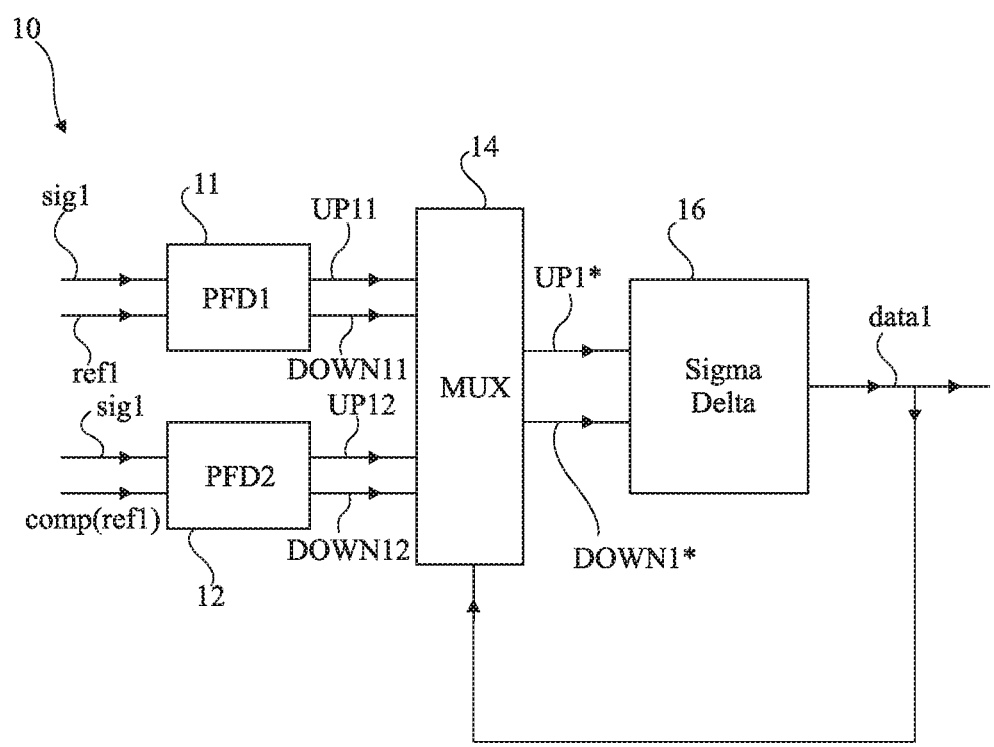
FIG. 1 shows, in the form of blocks, an embodiment of a propagation time determination device.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

The terms "about", "substantially", and "approximately" are used herein to designate a tolerance of plus or minus 10%, preferably of plus or minus 5%, of the value in question.

FIG. 1 is a block diagram of an embodiment of a device 10 of determination of a propagation time of a digital and periodic signal transmitted in electronic equipment (not shown in FIG. 1). Signal sig1, the propagation time of which is desired to be determined, is compared with the signal at the input of the equipment, identified to a reference signal ref1 or to a reference signal comp(ref1) complementary to reference signal ref1. As an example, the electronic device may be an imager.

Device 10 comprises two phase and/or frequency detectors 11 (PFD1) and 12 (PFD2); a multiplexer (MUX) 14; and a Sigma/Delta converter (Sigma Delta) 16.

Each phase and/or frequency detector 11, 12 receives, as an input, signal sig1 and a reference signal ref1, respectively, and its complementary comp(ref1). Each phase detector 11, 12 outputs two signals, respectively, UP11 and DOWN11, and UP12 and DOWN12.

Multiplexer 14 receives at its inputs output signals UP11 and DOWN11, and UP12 and DOWN12 from phase and/or frequency detectors 11 and 12, and a control signal data1. Multiplexer 14 outputs two comparison signals UP1* and DOWN1*. Signal UP1* is equal either to signal UP11, or to signal UP12 according to the state of control signal data1. Similarly, signal DOWN1* is equal either to signal DOWN11, or to signal DOWN12 according to the state of control signal data1.

Sigma/Delta converter 16 receives at its inputs output signals UP1* and DOWN1* from multiplexer 14, and outputs control signal data1. Sigma/Delta converter 16 is for example a first-order Sigma/Delta comparator.

Device 10 operates as follows.

Each phase and/or frequency detector 11, 12 compares signal sig1 either with reference signal ref1, or with reference signal comp(ref1). Comparing signal sig1 with reference signal ref1 enables to determine the phase shift of signal sig1 when said phase shift is in the range from 0 to π. Similarly, comparing signal sig1 and reference signal comp(ref1) enables to determine the phase shift of signal sig1 when said phase shift is in the range from −π to 0. Signals UP11, DOWN11, UP12, DOWN12 (the forming of these signals will be explained in relation with FIG. 2) output by phase and/or frequency detectors 11 and 12 represent the phase shift of signal sig1 respectively with respect to signal ref1 and to its complementary comp(ref1). These signals are supplied to multiplexer 14 which selects, according to the state of control signal data1, which pair of signals (UP11 and DOWN11, or UP12 and DOWN12) is transmitted to converter 16. More particularly, when signal data1 is at value 1, multiplexer 14 transmits the signals originating from detector 11, that is, signals UP11, DOWN11, and when signal data1 is equal to 0, multiplexer 14 transmits the signals originating from detector 12, that is, signals UP12, DOWN12.

Sigma/Delta converter 16 compares the phase shift determined by the signals output by multiplexer 14 with a threshold, generally equal with π, (or equal to the half-period of reference signal ref1 or of signal comp(ref1)). The result of this comparison is coded in signal data1. As an example, when the delay is longer than the threshold, signal data1 is equal to 0 and when the delay is shorter than the threshold, signal data1 is equal to 1. The value of the propagation time of the signal in the electronic device is determined according to the proportion of states 1 contained in signal data1.

An advantage of the embodiment described in relation with FIG. 1 is that it enables to calculate the phase shift of signal sig1 in the case where signal sig1 is early and in the case where signal sig1 is late with respect to the reference signal.

Another advantage of this embodiment, as compared with a propagation time determination device comprising a single phase and/or frequency detector, is that the device of FIG. 1 has more than one half-period of the input signal to send comparison signals UP1* and DOWN1* to Sigma/Delta converter 16. Indeed, with a single phase and/or frequency detector, multiplexer 14 is positioned before the phase and/or frequency detector, and selects, based on the control signal, the reference signal, that is, the reference signal or its complementary, having the input signal compared therewith. In the case where the device comprises a single detector, the comparison is performed after having the received the information of the control signal. In other words, the comparison signals are only supplied to the Sigma/Delta converter once the comparison has been performed, which takes time, and not after the reception of the control signal by the multiplexer. A difficulty, in this case, is to efficiently rate the phase and/or frequency detector to supply the signals on time to the converter. If the signals are not supplied on time, errors may appear, such as voltage peaks, for example. The embodiment described in relation with FIG. 1 does not raise this issue since the Sigma/Delta converter receives the comparison signals as soon as multiplexer 14 receives the control signal.

Figure 2:
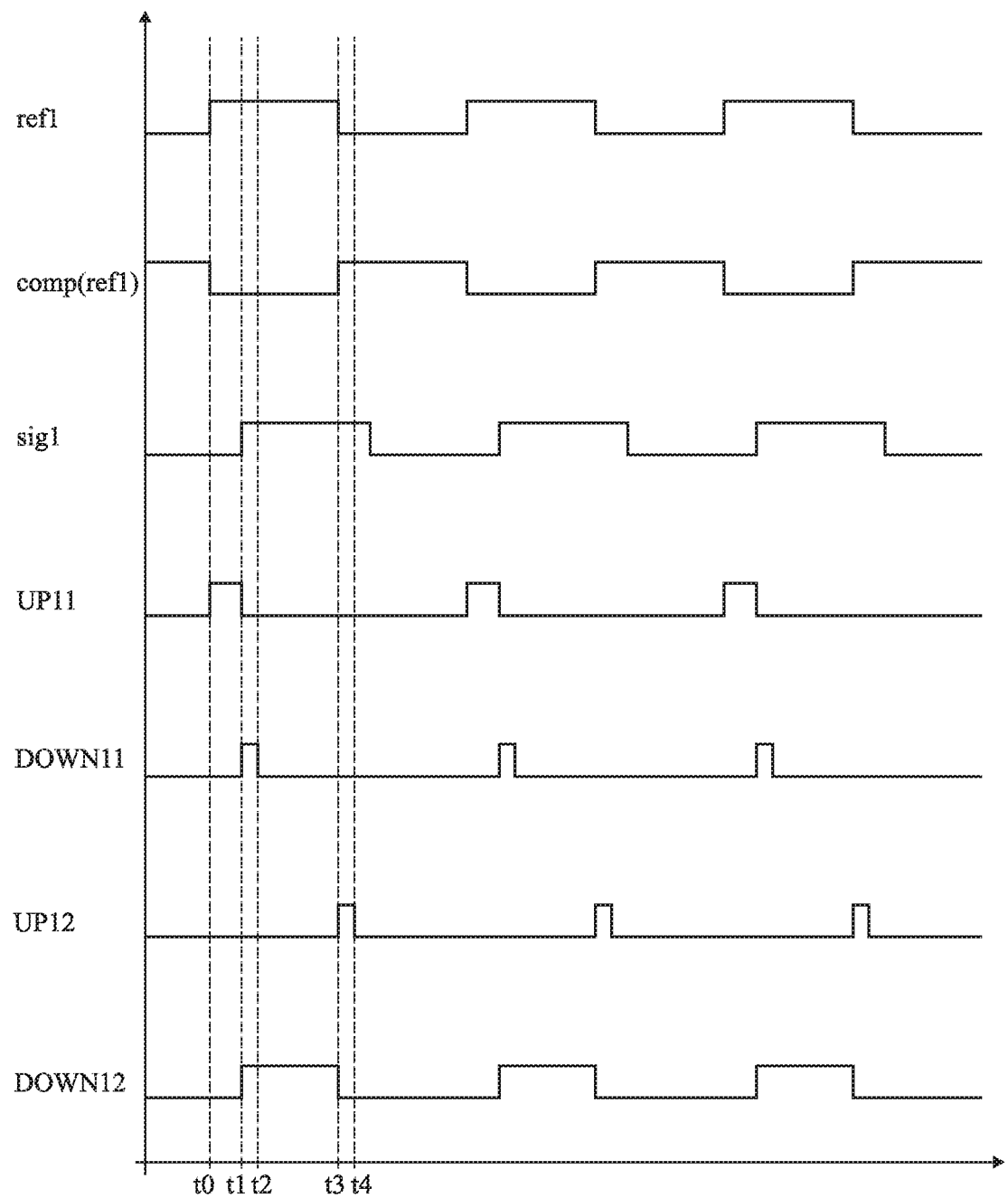

FIG. 2 shows timing diagram of signals present in the device of FIG. 1. More particularly, FIG. 2 shows timing diagrams of signal sig1, reference signals ref1 and comp(ref1), and output signals of phase and/or frequency detectors 11 and 12, UP11 et DOWN11, UP12 and DOWN12.

It is initially assumed that all the signals are in the low state except for signal comp(ref1), which is in the high state.

At a time t0, it is assumed that reference signal ref1 switches from a low state to a high state and reference signal comp(ref1) switches from a high state to a low state. This triggers the switching of signal UP11 from a low state to a high state and signals DOWN11, UP12, and DOWN12 remain in a low state.

At a time t1 subsequent to time t0, it is assumed that signal sig1 switches from a low state to a high state. This causes the switching of signal UP11 from a high state to a low state and the switching of signal DOWN11 from a low state to a high state. The duration of a pulse on signal UP11 is equal to the phase shift of signal sig1 with respect to signal ref1.

Further, the switching of signal Sig1 from a low state to a high state triggers the switching of signal DOWN12 from a low state to a high state.

At a time t2 subsequent to time t1, signal DOWN11 switches from a high state to a low state, since signals sig1 and ref1 are in a high state.

At a time t3 subsequent to time t2, it is assumed that signal ref1 switches from a high state to a low state (end of a half-period). This causes the switching of signal DOWN12 from a high state to a low state and the switching of signal UP12 from a low state to a high state.

At a time t4 subsequent to time t3, signal UP12 switches from a high state to a low state, since signals sig1 and comp(ref1) are in a high state.

Figure 3:
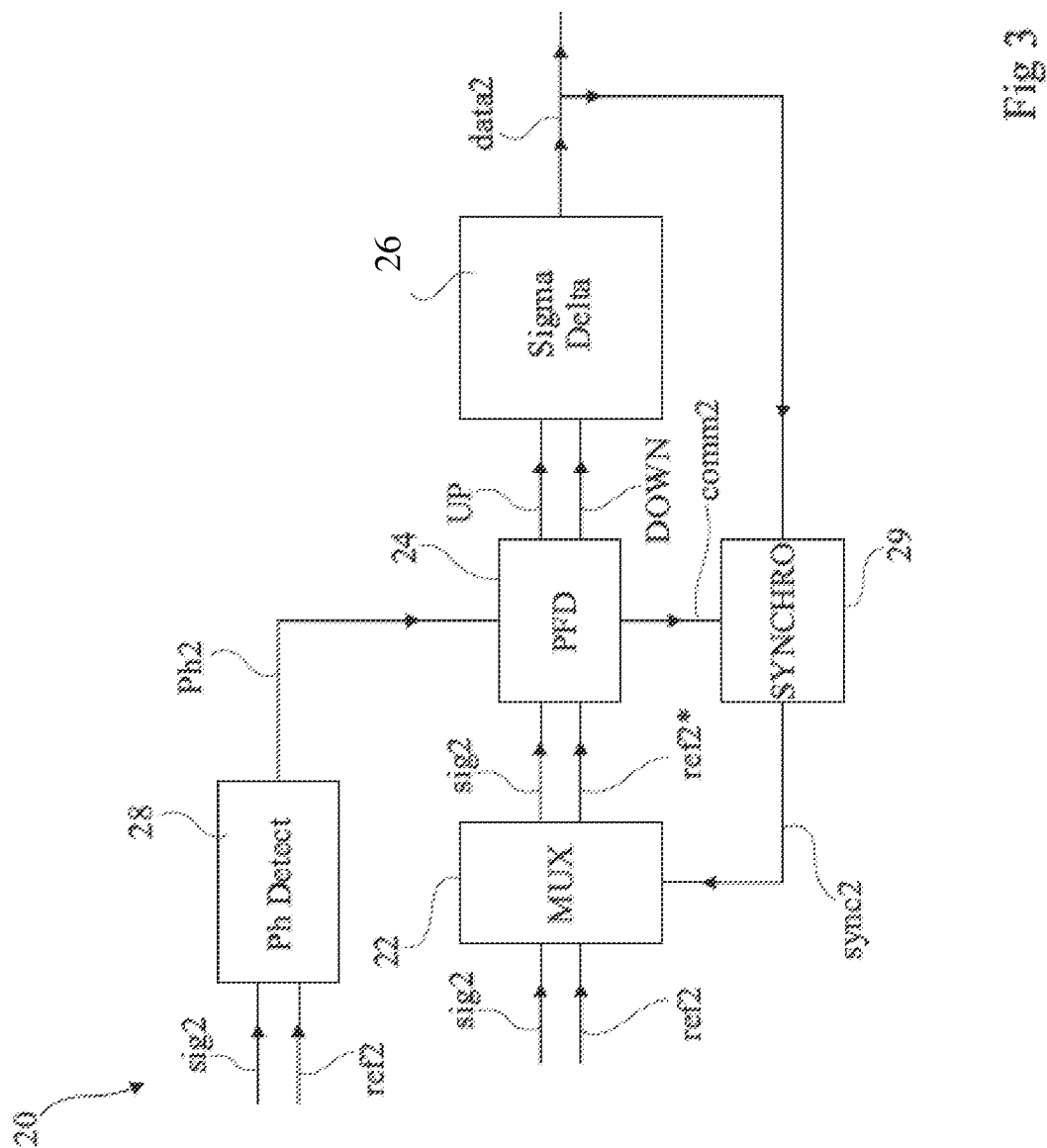
FIG. 3 shows, in the form of blocks, another embodiment of a propagation time determination device.

FIG. 3 is a block diagram of an embodiment of a device 20 of determination of a propagation time of a signal transmitted in electronic equipment (not shown in FIG. 3). Signal sig2, the propagation time of which is desired to be determined, is compared with the signal at the input of the equipment, identified to a reference signal ref2 or to a reference signal comp(ref2) complementary to reference signal ref2. As an example, the electronic device may be an imager.

Device 20 comprises a multiplexer (MUX) 22; a phase and/or frequency detector (PFD) 24; a Sigma/Delta converter (Sigma Delta) 26; a phase detector (Ph Detect) 28; and a synchronization device (SYNCHRO) 29.

Multiplexer 22 receives as an input signal sig2 and reference signal ref2. Further, multiplexer 22 is controlled by a signal sync2. Multiplexer 22 outputs signal sig2 and a reference signal ref2* corresponding, according to the state of signal sync2, either to reference signal ref2, or to a reference signal comp(ref2).

Phase and/or frequency detector 24 receives at its inputs signals sig2 and ref2* output by multiplexer 22. Further, detector 24 receives a signal Ph2. Detector 24 outputs a signal UP and a signal DOWN. Further, detector 24 outputs a control signal comm2. Signals UP and DOWN are generated in the same way as signals UP11 and DOWN11, UP12 and DOWN12 described in relation with FIGS. 1 and 2.

Sigma/Delta converter 26 receives at its inputs the signals UP and DOWN output by phase and/or frequency detector 24. Sigma/Delta converter 26 outputs a signal data2.

Phase detector 28 receives at its inputs signal sig2 and signal ref2. Phase detector 28 supplies as an output a control signal Ph2 to detector 24.

Synchronization device 29 receives the signal data2 transmitted by Sigma/Delta converter 26 and the signal comm2 transmitted by phase and/or frequency detector 24. Synchronization device 29 supplies as an output signal sync2 to multiplexer 22.

Device 20 operates as follows.

At an initial state, phase detector 28 establishes the phase shift between signal sig2 and reference signal ref2. More particularly, detector 28 establishes whether signal sig2 is late or early as compared with reference signal ref2. This information is then sent by signal Ph2 to phase and/or frequency detector 24 to initialize it on the earliest signal. Phase and/or frequency detector 24 then supplies this information, via signal comm2, to the synchronization device so that it controls multiplexer 22 with signal sync2. Based on signal sync2, the multiplexer supplies the phase and/or frequency detector with a signal ref2* equal to reference signal ref2 or to reference signal comp(ref2) (equivalent to the complementary of reference signal ref2). More particularly, if signal sig2 is late with respect to reference signal ref2, signal ref2* is equal to signal ref2, and if signal sig2 is early with respect to reference signal ref2, signal ref2* is equal to reference signal comp(ref2).

Signal sig2 is then compared with signal ref2* by phase and/or frequency detector 24 to supply Sigma/Delta converter 26 with signals UP and DOWN. Sigma/Delta converter 26 processes signals UP and DOWN and outputs signal data2 in the same way, described in relation with FIG. 1, as Sigma/Delta converter 16 processes signals UP1* and DOWN1* and outputs signal data1. Once signal data2 has been generated, it controls with signal comm2, via synchronization device 29, multiplexer 22 to establish signal ref2* to be sent to phase and/or frequency detector 28.

An advantage of this embodiment is that it enables to calculate the phase shift of signal sig2 in the case where signal sig2 is early and in the case where signal sig2 is late with respect to the reference signal.

Another advantage of this embodiment is that the presence of phase detector 28 enables to initialize phase and/or frequency detector 24 directly at the beginning of signal sig2.

Figure 4:
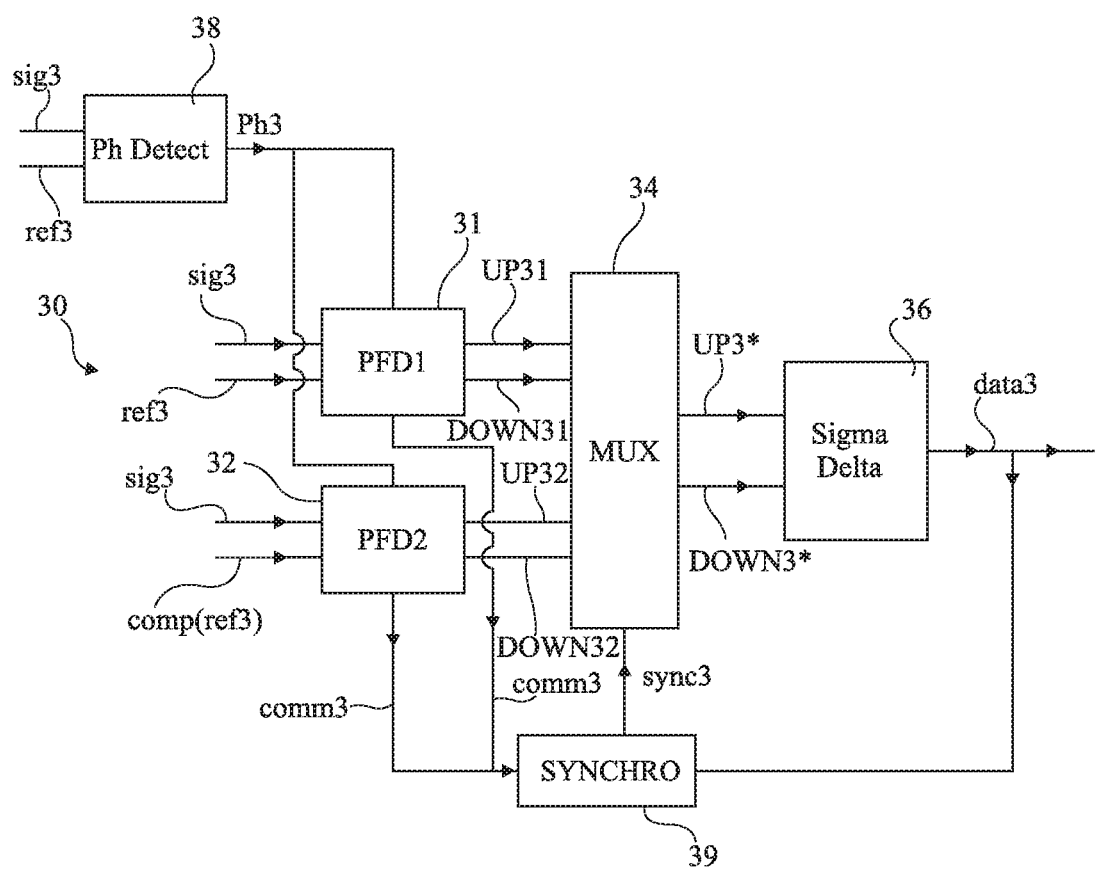
FIG. 4 shows, in the form of blocks, still another embodiment of a propagation time determination device.

FIG. 4 is a block diagram of an embodiment of a device 30 of determination of a propagation time of a signal transmitted in electronic equipment (not shown in FIG. 4). Signal sig3, the propagation time of which is desired to be determined, is compared with the signal at the input of the equipment, identified to a reference signal ref3 or to a reference signal comp(ref3) complementary to reference signal ref3. As an example, the electronic device may be an imager.

This embodiment is a combination of the embodiments described in relation with FIGS. 1 and 3. Thus, device 30 comprises two phase and/or frequency detectors 31 (PFD1) and 32 (PFD2); a multiplexer (MUX) 34; a Sigma/Delta converter (Sigma Delta) 36; a phase detector (Ph Detect) 38; and a synchronization device (SYNCHRO) 39.

Each phase and/or frequency detector 31, 32 receives, at its inputs, signal sig3 and a reference signal ref3, respectively, and reference signal comp(ref3) complementary to reference signal ref3. Each phase and/or frequency detector 31, 32 outputs two signals, respectively, signals UP31, DOWN31, and signals UP32, DOWN32.

Multiplexer 34 receives at its inputs the output signals of phase and/or frequency detectors 31 and 32, and a control signal sync3. Multiplexer 34 outputs two comparison signals UP3* and DOWN3*. Signal UP3* is equal either to signal UP31, or to signal UP32 according to the state of control signal sync3. Similarly, signal DOWN3* is equal either to signal DOWN31, or to signal DOWN32 according to the state of control signal sync3.

Sigma/Delta converter 36 receives at its inputs output signals UP3* and DOWN3* from multiplexer 34, and outputs a control signal data3.

Phase detector 38 receives at its inputs signal sig3 and signal ref3. Phase detector 38 outputs a signal Ph3.

Synchronization device 39 receives signal data3 transmitted by Sigma/Delta converter 36 and signal comma transmitted by phase and/or frequency detectors 31 and 32. Synchronization device 39 supplies as an output signal sync3 to multiplexer 34.

The operation of device 30 is the same as that of device 10 described in relation with FIG. 1, with the difference that the phase and/or frequency detectors are initialized by means of phase detector 39, similarly to what is described in relation with FIG. 3.

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device comprising:
   a first detector configured to compare a phase of an input signal with respect to a first reference signal and output a first pair of signals representative of a first phase shift with respect to the first reference signal;
   a second detector configured to compare the phase of the input signal with respect to a second reference signal and output a second pair of signals representative of a second phase shift with respect to the second reference signal; and
   a Sigma/Delta converter coupled to the first detector and the second detector, the Sigma/Delta converter configured to determine a propagation time of the input signal based on the first and the second pair of signals.

2. The device of claim 1, wherein the second reference signal is configured to be equal to a complementary of the first reference signal.

3. The device of claim 1, wherein the Sigma/Delta converter is capable of performing a comparison with respect to a threshold.

4. The device of claim 3, wherein the threshold corresponds to a half-period of the first or of the second reference signal.

5. The device of claim 1, wherein the Sigma/Delta converter is a first-order converter.

6. The device of claim 1, further comprising a multiplexer coupled between the first and the second detectors and the Sigma/Delta converter, the multiplexer being configured to receive the first and the second pair of signals and output the first pair of signals or the second pair of signals.

7. The device of claim 6, wherein the multiplexer is capable of being controlled by a control signal originating from the Sigma/Delta converter.

8. The device of claim 1, further comprising a phase detector configured to receive the input signal and the first reference signal and output a control signal indicative of phase information of the input signal with respect to the first reference signal to the first detector and the second detector.

9. The device of claim 6, further comprising a synchronization device coupled to the first and the second detectors, to the multiplexer, and to the Sigma/Delta converter.

10. The device of claim 9, wherein the multiplexer is configured to be controlled by a signal originating from the synchronization device.

11. A device comprising:
a phase detector configured to receive an input signal and a first reference signal and output a control signal with a phase information of the input signal with respect to the first reference signal;
a first detector comprising an input coupled to the output of the phase detector, the first detector configured to compare the phase information of the input signal with respect to the first reference signal and output a first pair of signals representative of a first phase shift with respect to the first reference signal; and
a Sigma/Delta converter configured to interpret the first pair of signals to determine a propagation time of the input signal.

12. The device of claim 11, further comprising a multiplexer coupled between the first detector and the Sigma/Delta converter.

13. The device of claim 12, further comprising a synchronization device coupled to the first detector, to the multiplexer, and to the Sigma/Delta converter.

14. The device of claim 11, wherein the Sigma/Delta converter is capable of performing a comparison with a threshold.

15. The device of claim 11, wherein the Sigma/Delta converter is a first-order converter.

16. The device of claim 11, further comprising a second detector comprising an input coupled to the output of the phase detector, the second detector configured to compare the phase information of the input signal with respect to a second reference signal and output a second pair of signals representative of a second phase shift with respect to the second reference signal.

17. The device of claim 16, wherein the second reference signal is equal to a complementary of the first reference signal.

18. The device of claim 16, further comprising a synchronization device coupled to the first detector, to the second detector, to a multiplexer coupled between the first detector and the Sigma/Delta converter, and to the Sigma/Delta converter.

19. A device comprising:
a phase detector configured to receive an input signal and a first reference signal and output a control signal with a phase information of the input signal with respect to the first reference signal;
a first detector comprising input nodes to receive the input signal and the first reference signal and a first control input node to receive the output of the phase detector, the first detector configured to output a first pair of signals representative of a first phase shift with respect to the first reference signal;
a second detector comprising input nodes to receive the input signal and a second reference signal and a first control input node to receive the output of the phase detector, the second detector configured to output a second pair of signals representative of a second phase shift with respect to the second reference signal; and
a Sigma/Delta converter configured to interpret the first pair of signals and the second pair of signals to determine a propagation time of the input signal.

20. The device of claim 1, further comprising:
a multiplexer coupled between the first and the second detectors and the Sigma/Delta converter, the multiplexer being configured to receive the first and the second pair of signals and output the first pair of signals or the second pair of signals to the Sigma/Delta converter; and
a synchronization device coupled to the first detector, to the second detector, to the multiplexer, and to the Sigma/Delta converter and configured to provide a synchronization signal to the multiplexer.

* * * * *